United States Patent [19]

Matsuda et al.

[11] Patent Number: 5,012,447
[45] Date of Patent: Apr. 30, 1991

[54] BIT LINE STRUCTURE FOR A DYNAMIC TYPE SEMICONDUCTOR MEMORY DEVICE

[75] Inventors: Yoshio Matsuda; Kazuyasu Fujishima, both of Hyogo, Japan

[73] Assignee: Mitsubishi Denki Kabushiki Kaisha, Tokyo, Japan

[21] Appl. No.: 276,741

[22] Filed: Nov. 28, 1988

[30] Foreign Application Priority Data

Nov. 28, 1987 [JP] Japan .................................. 62-300977

[51] Int. Cl.[5] .......................... G11C 5/06; G11C 11/40
[52] U.S. Cl. ..................................... 365/206; 365/149
[58] Field of Search ............... 365/149, 205, 206, 207, 365/208

[56] References Cited

FOREIGN PATENT DOCUMENTS 167281 1/1986 European Pat. Off. ............. 365/149
60-254489 12/1985 Japan .
62-51096 3/1987 Japan .

OTHER PUBLICATIONS

ISSCC 87/Feb. 26, 1987/Session XVI: "Microprocessors-Special Purpose", by P. W. Bosshart, C. R. Hewes, M-Chamg Change, K-Kit Chau, et al.

*Primary Examiner*—Joseph A. Popek
*Attorney, Agent, or Firm*—Lowe, Price, LeBlanc, Becker & Shur

[57] ABSTRACT

Each of the bit lines constituting each of a plurality of bit line pairs included in a portion of a memory cell array comprises even-numbered intersecting portions. At the intersecting portion, the materials of respective bit lines are different from each other. The bit lines are formed of the same material at portions other than the intersecting portions. The intersecting portions are arranged such that one of the bit lines constituting each bit line pair neighbors one of the bit lines constituting an adjacent one of the bit line pairs for a first length and neighbors the other one of the bit lines constituting the adjacent bit line pair for a second length; and the other one of the bit lines constituting the bit line pair neighbors the one of the bit lines of the adjacent bit line pair for the first length and neighbors the other one of the bit lines of the adjacent bit line pair for the second length.

14 Claims, 10 Drawing Sheets

BIT LINE STRUCTURE FOR A DYNAMIC TYPE SEMICONDUCTOR MEMORY DEVICE

CROSS REFERENCE TO RELATED CO-PENDING APPLICATIONS

Related co-pending applications of particular interest to the present invention are U.S. Ser. No. 131,633 entitled "Bit Line Structure for Semiconductor Memory Device" filed on Dec. 11, 1987 and U.S. Ser. No. 236,361 entitled "Dynamic Semiconductor Memory Device" filed on Aug. 25, 1988.

BACKGROUND OF THE INVENTION

1. Field of the Invention

The present invention generally relates to dynamic type semiconductor memory devices and, more specifically, to a bit line structure capable of reducing errors in reading.

FIG. 1 is a block diagram showing the whole structure of a common dynamic type semiconductor memory device (hereinafter referred to as a DRAM).

Referring to the figure, in the memory cell array 1, a plurality of word lines and a plurality of bit line pairs are arranged intersecting with each other, with memory cells provided at respective intersections. The word lines in the memory cell array 1 are connected to a row decoder 3 through a word driver 2. The bit line pairs in the memory cell array 1 are connected to a column decoder 6 through a sense amplifier portion 4 and an I/O switching portion 5. A row address buffer 7 is connected to the row decoder 3, while a column address buffer 8 is connected to the column decoder 6.

In data reading, first, the row address buffer applies an externally applied address signal AD as a row address signal RA to the row decoder 3 in response to an externally applied row address strobe signal $\overline{RAS}$. The row decoder 3 selects one of the plurality of word lines in response to the row address signal RA. Consequently, data in the plurality of memory cells connected to the selected word lines are read to respective corresponding bit lines, with the data detected and amplified by the sense amplifier portion 4. Thereafter, the column address buffer 8 applies an externally applied address signal AD as a column address signal CA to the column decoder 6 in response to an externally applied column address strobe signal $\overline{CAS}$. The column decoder 6 selects one of the data of one row latched in the sense amplifier portion 4 in response to the column address signal CA. The selected data is externally outputted as an output data $D_{OUT}$ through the I/O switch portion 5 and through an output buffer 9.

In data writing, an input data $D_{in}$ is written in a memory cell selected by the row decoder 3 and the column decoder 6 through an input buffer 10 and I/O switch portion 5.

FIG. 2 is a schematic diagram showing a main portion of the memory cell array of the DRAM shown in FIG. 1.

Referring to the figure, a plurality of bit line pairs BL, $\overline{BL}$ are arranged intersecting with a plurality of word lines WL. Memory cells MC are connected to the intersections between the bit lines BL, $\overline{BL}$ and the word lines WL. Each memory cell MC comprises a transfer gate TG formed of an N channel MOS transistor and a capacitance Cs storing information of "H" or "L" level. Dummy word lines DWL0, DWL1 are arranged intersecting with the bit line pairs BL, $\overline{BL}$. Dummy cells DC0 are provided at intersections between the dummy word line DWL0 and the bit lines BL, while dummy cells DC1 are provided at the intersections between the dummy word line DWL1 and the bit lines $\overline{BL}$. An intermediate potential $V_{cc}/2$ between the power supply potential $V_{cc}$ and the ground potential is stored in the dummy cells DC0 and DC1.

A sense amplifier SA is connected to each bit line pair BL and $\overline{BL}$. The plurality of word lines WL and the dummy word lines DWL0 and DWL1 are connected to the row decoder 3. The bit line pairs BL and $\overline{BL}$ are connected to a data input/output line pairs I/O and $\overline{I/O}$ through transfer gates Q1 and Q2 which are formed of N channel MOS transistors. The transfer gates Q1 and Q2 have their gates connected to the column decoder 6.

In data reading, one word line WL is selected by the row decoder 3, with the potential thereof raised to the "H" level. Consequently, the data in the memory cells MC connected to the word line WL are respectively read to the corresponding bit line BL or $\overline{BL}$. If the data are read to the bit lines BL, for example, the potential of the dummy word line DWL1 is raised to the "H" level, and the potential of the dummy cells DC1 is read to corresponding bit lines $\overline{BL}$. Consequently, the potential of the bit lines $\overline{BL}$ becomes the reference potential. Meanwhile, the potential of the bit lines BL, from which data have been read, becomes a little higher or lower than the reference potential. Thereafter, the potential difference between the bit line pairs BL and $\overline{BL}$ is amplified by a sense amplifier SA. Any one set of the transfer gates Q1 and Q2 is turned on by the column decoder 102, and the data on the bit line pair BL and BL connected thereto are read on the data input/output line pair I/O and $\overline{I/O}$.

Now, the potential which appears on each bit line pair BL, $\overline{BL}$ in data reading will be discussed.

FIG. 3 is a schematic diagram showing capacitance generated on each bit line.

As is shown in the figure, a capacitance $C_1$ exists between each bit line and the ground potential (fixed potential) through a cell plate or a substrate; a bit line capacitance $C_2$ exists between the bit lines constituting a pair; and a bit line capacitance $C_3$ exists between adjacent bit line pairs. The cell capacitance of the memory cell MC is represented by $C_S$. Each of the bit lines has the length of l.

When the "H" level data is stored in a memory cell by $V_{cc}$ writing, the charges stored in the memory cell will be $C_S V_{cc}$. Meanwhile, when the "L" level data is stored in the memory cell by 0V writing, the charges stored in the memory cell will be 0. Charges $C_S V_{cc}/2$ (b $V_{cc}/2$ writing) are stored in the dummy cells DC0 and DC1. It is assumed that the bit line pairs are precharged to the supply potential $V_{cc}$ prior to the reading operation.

Now, let us consider a case in which a memory cell connected to the bit line BL1 is selected and a dummy cell is connected to the bit line In that case, the potential $V_{BL1}$ of the bit line BL1 and the potential $V_{\overline{BL1}}$ of the bit line BL1 be represented by the following equation. Namely, the potential $V_{BL1}$ of the bit line BL1 when the "L" level data is read from the selected memory cell will be represented by the following equation.

$$V_{BL1} = V_{cc} - \frac{C_S \cdot V_{cc}}{C_1 + C_2 + C_3} + \qquad (1)$$

-continued
$$\frac{C_3}{C_1 + C_2 + C_3} \Delta V_{BL0} + \frac{C_2}{C_1 + C_2 + C_3} \Delta V_{\overline{BL1}}$$

The potential $V_{\overline{BL1}}$ of the bit line $\overline{BL1}$ when the "H" level data is read from the selected memory cell will be represented by the following equation.

$$V_{\overline{BL1}} = V_{cc} + \frac{C_3}{C_1 + C_2 + C_3} \Delta V_{\overline{BL0}} + \qquad (2)$$

$$\frac{C_2}{C_1 + C_2 + C_3} \Delta V_{BL1}$$

The potential $V_{\overline{BL1}}$ the bit line $\overline{BL1}$ will be represented by the following equation.

$$V_{\overline{BL1}} = V_{cc} - \frac{\frac{1}{2} C_s V_{cc}}{C_1 + C_2 + C_3} + \qquad (3)$$

$$\frac{C_2}{C_1 + C_2 + C_3} \Delta V_{BL1} + \frac{C_3}{C_1 + C_2 + C_3} \Delta V_{BL2}$$

Where $\Delta V_{BL0}$, $\Delta V_{BL1}$, $\Delta V_{\overline{BL1}}$ and $\Delta V_{BL2}$ are changes of the potential on the respective bit lines represented by the indices.

In consideration of the fact that the precharge level of the bit line BL1 is the same as that of the bit line $\overline{BL1}$, that voltage difference between the bit lines constituting a pair will be represented by the following equation, derived from the operation of (1)–(3) and (2)–(3):

$$V_{BL1} - V_{\overline{BL1}} = \Delta V_{BL1} - \Delta V_{\overline{BL1}} = \pm \frac{1}{1+\alpha} \cdot \frac{\beta}{2} + \qquad (4)$$

$$\frac{\gamma}{1+\alpha} \cdot (\Delta V_{BL0} - \Delta V_{BL2})$$

Where $$\alpha = \frac{C_2}{C_1 + C_2 + C_3}, \beta = \frac{C_s \cdot V_{cc}}{C_1 + C_2 + C_3},$$

$$\gamma = \frac{C_3}{C_1 + C_2 + C_3},$$

In the equation (4), the "+" of the double sign corresponds to the reading of the "H" level data, while "−" corresponds to the reading of the "L" level data. The first term of the right side of the equation (4) is the original reading voltage difference, and the second term is a noise component applied through the coupling capacitance from the bit line BL0 of the adjacent bit line pair and the bit line BL2 of another adjacent bit line pair.

Meanwhile, when the bit line pitch becomes smaller and smaller as the degree of integration of the memory cell becomes higher and higher, the capacitance $C_3$ between the bit line pair is increased, and the second term of the right side of the equation (4) becomes larger and larger. Consequently, the reading voltage is reduced, whereby the reading margin is decreased and the soft error rate is increased, causing malfunctions.

In order to solve the above described problem, the inventors of the present invention have proposed a semiconductor memory device in which the degradation of the reading voltage amplitude caused by the noise derived from the bit line capacitance between adjacent bit line pairs can be made 0 (see "Bit Line Structure for Semiconductor Memory Device" which was mentioned as the related co-pending application).

The structure of the proposed semiconductor memory device will be described with reference to FIG. 4.

As shown in FIG. 4, each of the bit line pairs BL0, $\overline{BL0}$,BL1,$\overline{BL1}$, ... is divided into 4 sections a, b, c and d each having the length of 1/4, and the bit lines of the bit line pair intersect with each other at the points CP1, CP2 and CP3 of division, in the following manner.

(1) The bit lines BL0 and $\overline{BL0}$ intersect with each other at the point CP2.

(2) The bit lines BL1 and $\overline{BL1}$ with each other at the points CP1 and CP3.

(1)' The bit lines BL2 and $\overline{BL2}$ intersect with each other at the point CP2.

(2)' The bit lines BL3 and $\overline{BL3}$ intersect with each other at the points CP1 and CP3.

Namely, counting from the bit line pair BL0 and $\overline{BL0}$, the bit lines of the odd-numbered bit line pair intersect with each other at the point CP2, while the bit lines of the even-numbered bit line pair intersect with each other at the points CP1 and CP3. Therefore, the capacitive coupling noise derived from adjacent bit line pairs to each bit line pair will be represented by the following equations, when it is considered in the same manner as the prior art of FIG. 3. (1) The capacitive coupling noise $V_{BL1}$, and $V_{\overline{BL1}}$ to the bit lines BL0 and $\overline{BL0}$ from adjacent bit lines will be represented by the following equation.

$$V_{BL1}' = \frac{1}{4} \cdot \frac{\gamma}{1+\alpha} (\Delta V_{BL0} + \Delta V_{BL2} + \Delta V_{\overline{BL2}} + \Delta V_{\overline{BL0}})$$

$$V_{\overline{BL1}}' = \frac{1}{4} \cdot \frac{\gamma}{1+\alpha} (\Delta V_{BL2} + \Delta V_{BL0} + \Delta V_{\overline{BL0}} + \Delta V_{\overline{BL2}})$$

The bit line BL1 receives the noise $\Delta V_{BL0}$ in the section a, the noise $\Delta V_{BL2}$ in the section b, the noise $\Delta V_{\overline{BL2}}$ in the section c, and the noise $\Delta V_{\overline{BL0}}$ the section d, respectively. The bit line $\overline{BL1}$ receives the noise $\Delta V_{BL2}$ in the section a, the noise $\Delta V_{BL0}$ the section b, the noise $\Delta V_{\overline{BL0}}$ in the section c, and the noise $\Delta V_{\overline{BL2}}$ in the section d, respectively. Therefore, the capacitive coupling noise $\Delta V_{BL1}$ and the $\Delta V_{\overline{BL1}}$ are exactly equal to each other.

(2) The capacitive coupling noise $\Delta V_{BL2}$, and to the bit lines BL2 and $\overline{BL2}$ from adjacent bit line pairs will be represented by the following equation.

$$V_{BL2}' = \frac{1}{4} \cdot \frac{\gamma}{1+\alpha} (\Delta V_{BL1} + \Delta V_{\overline{BL1}} + \Delta V_{BL3} + \Delta V_{\overline{BL3}})$$

$$V_{\overline{BL2}}' = \frac{1}{4} \cdot \frac{\gamma}{1+\alpha} (\Delta V_{BL3} + \Delta V_{\overline{BL3}} + \Delta V_{BL1} + \Delta V_{\overline{BL1}})$$

The bit line BL2 receives the noise $\Delta V_{BL1}$ the section a, the noise $\Delta V_{\overline{BL1}}$ in the section b, the noise $\Delta V_{BL3}$ in the section c, and the noise $\Delta V_{\overline{BL3}}$ in the section d, respectively. The bit line $\overline{BL2}$ receives the noise $\Delta V_{BL3}$ in the section a, the noise $\Delta V_{\overline{BL3}}$ in the section b, the noise $\Delta V_{BL1}$ in the section c, and the noise $\Delta V_{\overline{BL1}}$ in the section d, respectively. Therefore, the capacitive coupling noise $\Delta V_{BL2}$, is exactly equal to the noise $\Delta V_{\overline{BL2}}$.

In the same manner, the capacitive coupling noise received by each of the bit lines of the bit line pairs from adjacent bit line pairs will be the same in all of the bit line pairs.

(3) The capacitive coupling noise $\Delta V_{BL0}$ and $\Delta V_{\overline{BL0}}$ to the bit lines BL0 and $\overline{BL0}$ at the end portions of the memory array will be represented by the following equation.

$$V_{BL0}' = \frac{1}{2} \cdot \frac{\gamma}{1 + \alpha} (\Delta V_{BL1} + \Delta V_{\overline{BL1}})$$

$$V_{\overline{BL0}}' = \frac{1}{2} \cdot \frac{\gamma}{1 + \alpha} (\Delta V_{BL1} + \Delta V_{\overline{BL1}})$$

The bit line BL0 receives the noise $\Delta V_{BL1}$ in the section c, and the noise $\Delta V_{\overline{BL1}}$ in the section d. The bit line $\overline{BL0}$ receives the noise $\Delta V_{BL1}$ in the section a, and the noise $\Delta V_{\overline{BL1}}$ the section b. Therefore, the capacitive coupling noise $\Delta V_{BL0}$, is exactly equal to the noise $\Delta V_{\overline{BL0}}$.

As described above, in the semiconductor memory device of FIG. 4, the capacitive coupling noise to each of the bit lines constituting bit line pairs from adjacent bit line pairs will be the same in reading signals from memory cells. Therefore, the reduction of the reading voltage difference derived from the capacitive coupling noise can be eliminated, whereby the reading margin is enlarged and the soft error ratio can be reduced.

In such semiconductor memory devices, each of the intersections provided at the points CP1, CP2 and CP3 can not be laid out in perfect symmetry with regard to the bit line pair.

FIG. 5 is a plan view showing the intersecting portions of the bit lines, and FIG. 6 is a cross sectional view taken along line VI—VI of FIG. 5.

Referring to both figures, an oxide film 28 for isolation defining an active region is formed on a main surface of a semiconductor substrate 25. In the active region, impurity regions 29a and 29b defining a transistor and a capacitor region of a memory cell are formed. A cell plate 27 defining the capacitor is formed above the impurity region 29b with an insulating film interposed therebetween. An interlayer insulating film 30 is formed covering entirely over the main surface of the semiconductor substrate 25. A word line 21 controlling conduction of the memory transistor of the memory cell is formed in the interlayer insulating film 30. A bit line 22 is formed on the interlayer insulating film 30 in a direction orthogonal to the word line 21. The bit line 22 is connected to the impurity region 29a through a contact hole 23 formed on the interlayer insulating film 30. The bit line 22 is formed of aluminum interlayer and the like. At the lower bit line of the intersecting portion of the bit line pair, the aluminum interlayer is connected to a polysilicon interlayer 24 through a contact 26.

As is apparent from the above described structure, at the intersecting point of the bit line pair, the material of one bit line is different from the other bit line. Therefore, the value of the capacitance $C_1$ shown in FIG. 3 at this portion is different in each bit line. Consequently, the reading voltage difference between each of the bit lines is degraded, whereby the decrease of the soft error ratio is not fully accomplished. Namely, the bit lines viewed as a whole do not have a well balanced layout. In consideration of the balance between the bit line pairs, the inventors of the present invention have proposed a semiconductor memory device such as shown in FIG. 7 (see "Bit Line Structure for Semiconductor Memory Device" which was mentioned as the related co-pending application).

The semiconductor memory device of FIG. 7 is different from that of FIG. 4 in that additional intersecting portions are provided at the point CP4 near the end portion of the bit lines in the odd-numbered bit line pairs BL0, $\overline{BL0}$, BL2, $\overline{BL2}$ . . . .

In the semiconductor memory device of FIG. 7, each of the even-numbered bit line pairs BL1, $\overline{BL1}$, BL3, $\overline{BL3}$, . . . has two intersecting portions. Therefore, a well-balanced layout can be provided for the bit line pairs, when viewed as a whole. If the bit line is formed of Al layer and the wiring layer which can intersect therewith is formed of polysilicon layer, the bit line BL1 should be formed of Al and the bit line $\overline{BL1}$ should be formed of polysilicon at the intersection of the point CP1, while the bit line BL1 should be formed of polysilicon and the bit line $\overline{BL1}$ should be formed of Al at the intersection of the point CP3. By doing so, the capacitance $C_1$ of the bit line pairs becomes equal to each other, whereby the imbalance of the stray capacitance can be avoided. In the semiconductor device of FIG. 7, a dummy intersecting point is added at the point CP4 so that the capacitance of the odd-numbered bit line pairs will be balanced, for the same purpose. Consequently, capacitances for all bit lines can be balanced.

In the semiconductor memory devices of FIGS. 4 and 7, the bit line pairs are divided into four sections, and each of the bit lines constituting a pair intersect with each other at appropriate positions. The number of sections may be an integer multiple of 4 such as 8, 12 and so on to provide the same effect. FIG. 8 shows an example in which the bit lines are divided into 8 sections In the example of FIG. 8, the structure of FIG. 7 is repeated twice It is apparent that the example of FIG. 8 provides the same effect as that of FIG. 7.

However, even in the structures of the bit line pairs shown in FIGS. 7 and 8, the capacitive coupling noise of respective bit line pairs is not equal to each other in the strict sense. The reason for this is that the capacitive coupling noise is generated in the small portion between the point CP4 and the sense amplifier SA, preventing well-balanced layout of the bit line pairs.

SUMMARY OF THE INVENTION

One object of the present invention is to provide a bit line structure of a semiconductor memory device reducing errors in reading signals.

Another object of the present invention is to provide a bit line structure of a semiconductor memory device in which capacitive coupling noise of each of the bit lines constituting a bit line pair is equal to each other.

A further object of the present invention is to provide a bit line structure of a semiconductor memory device in which the capacitance of each of the bit lines constituting the bit line pair in association with the ground potential is equal to each other.

In order to attain the above described objects, the semiconductor memory device in accordance with the present invention comprises: a plurality of memory cells; a plurality of bit line pairs; and a plurality of sense amplifiers, each of the plurality of bit line pairs having even-numbered intersecting portions, and the intersecting portions arranged such that one of the bit lines constituting each said bit line pair neighbors one of the bit lines constituting an adjacent one of the said bit line pairs for a first length and neighbors the other one of the bit lines constituting the said adjacent bit line pair for a second length; and the other one of the bit lines constituting the bit line pair neighbors the said one of the bit lines of the said adjacent bit line pair for the said first length and neighbors said the other one of the bit lines of the said adjacent bit line pair for the said second length.

In the semiconductor memory device structured as described above, the capacitive coupling noise of each of the bit lines constituting the bit line pairs is equal to each other, whereby the stray capacitances are well-balanced, preventing degradation of reading potential difference between bit lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 9:
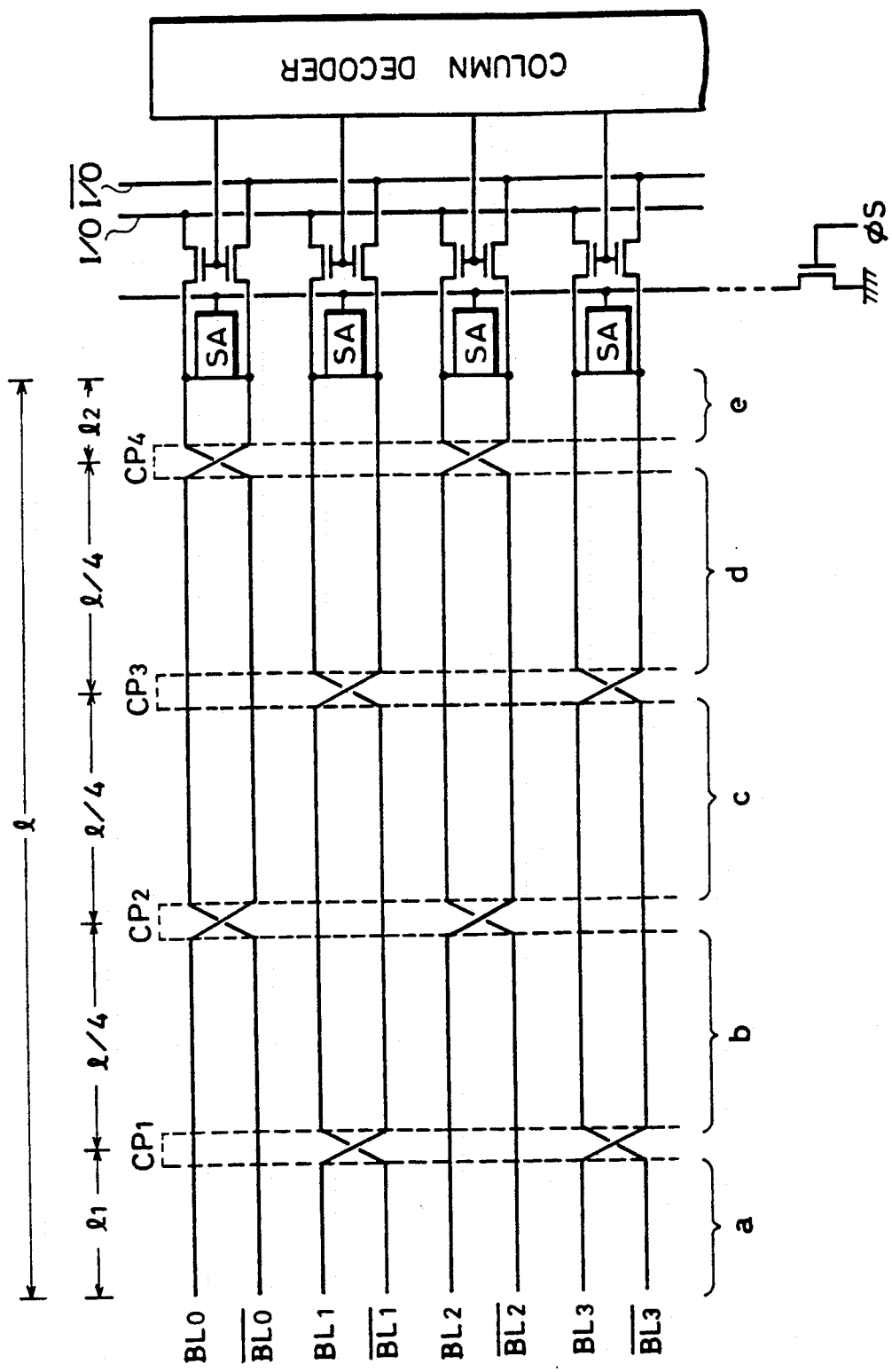
FIG. 9 shows a bit line structure in accordance with one embodiment of the present invention.

FIG. 9 shows a bit line structure of a semiconductor memory device in accordance with one embodiment of the present invention.

The structure will be described in the following with reference to the figure.

Each of the bit line pairs ($BL_0$, $\overline{BL_0}$, $BL_1$, $\overline{BL_1}$, ...) is divided into 5 sections a, b, c, d and e, and the bit lines of each bit line pair intersect with each other at the points $CP_1$, $CP_2$, $CP_3$ and $CP_4$, in the following manner.

(1) $BL_0$ and $\overline{BL_0}$ with each other at the points $CP_2$ and $CP_4$.

(2) $BL_1$ and $\overline{BL_1}$ intersect with each other at the points $CP_1$ and $CP_3$.

(3) $BL_2$ and $\overline{BL_2}$ intersect with each other at the points $CP_2$ and $CP_4$.

(4) $BL_3$ and $\overline{BL_3}$ intersect with each other at the points $CP_1$ and $CP_3$.

Figure 1:
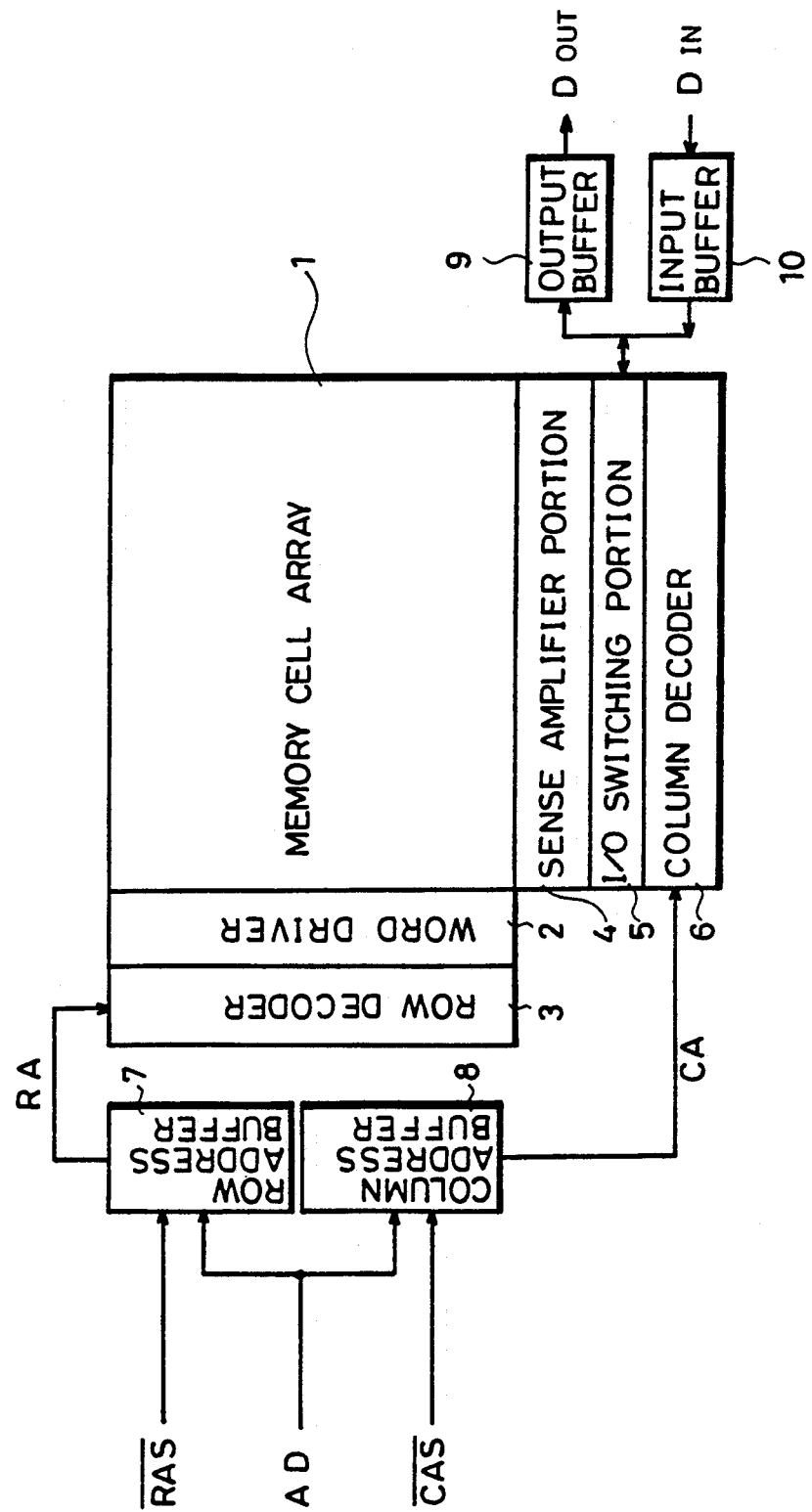
FIG. 1 is a block diagram showing a structure of a common DRAM.
Figure 2:
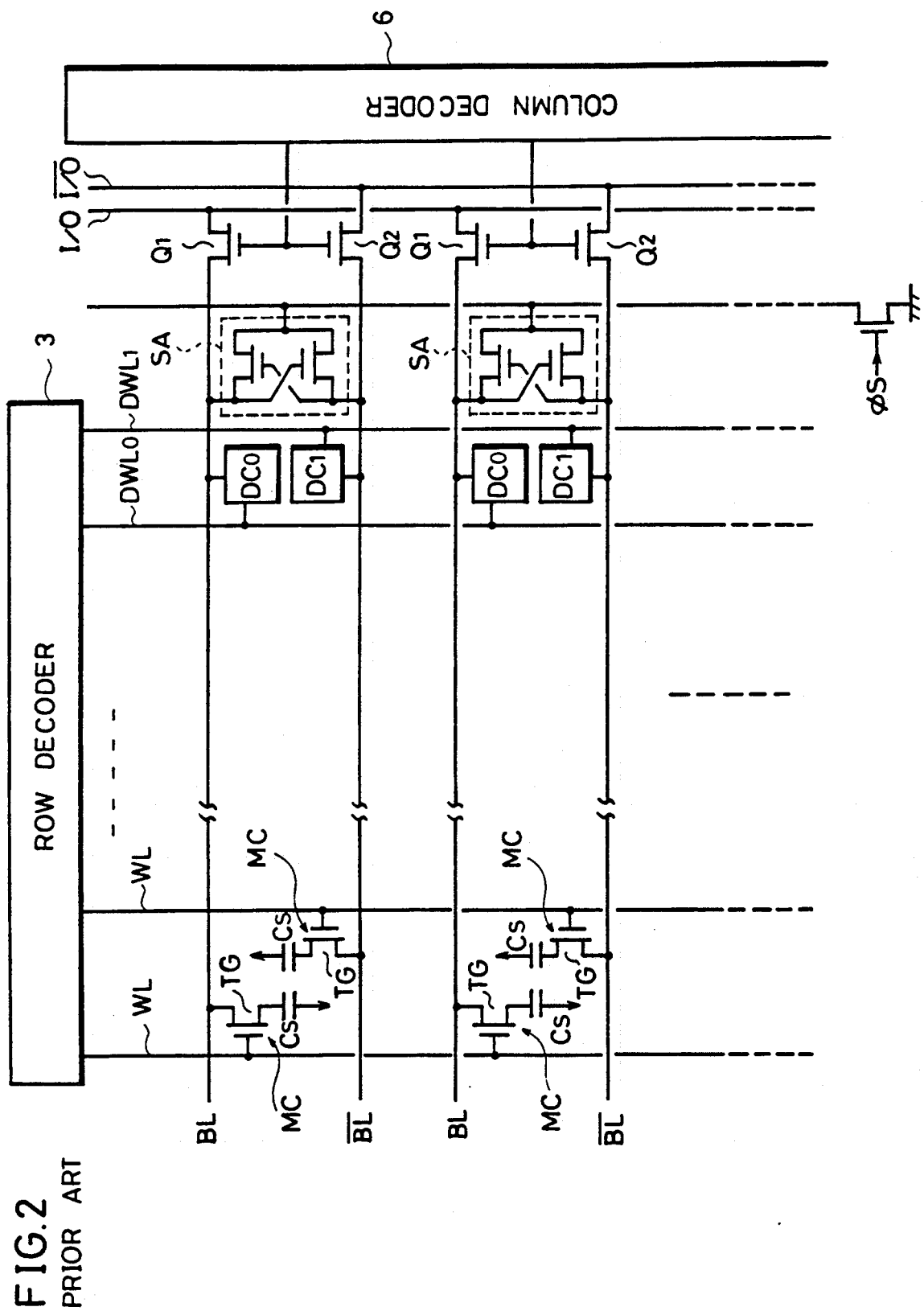
FIG. 2 is a schematic diagram showing a portion of the memory cell of FIG. 1, illustrating conventional bit line structure.
Figure 3:
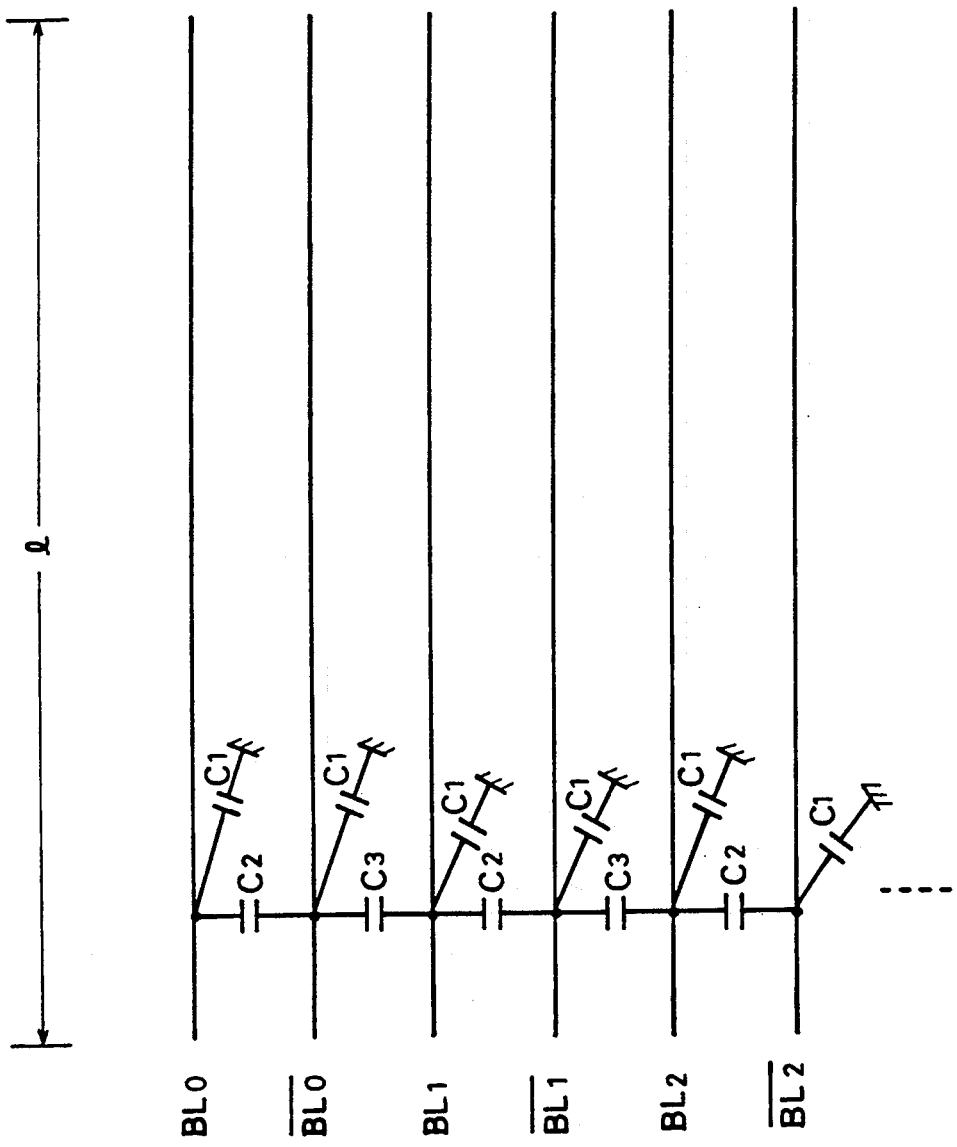
FIG. 3 schematically shows capacitances generated on each of the bit lines shown in FIG. 2.
Figure 4:
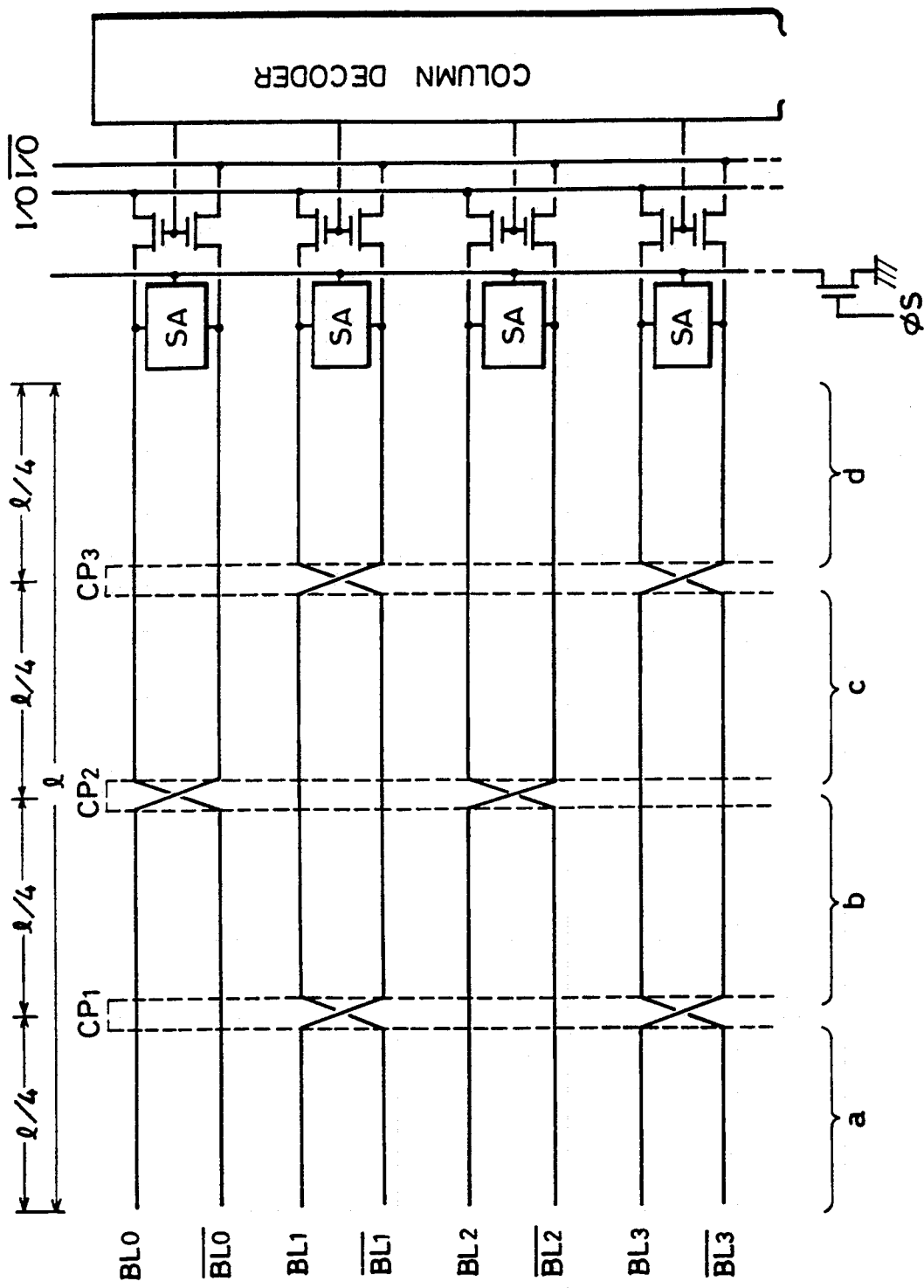
FIG. 4 shows one example of a structure of the bit line pair the related application.
Figure 5:
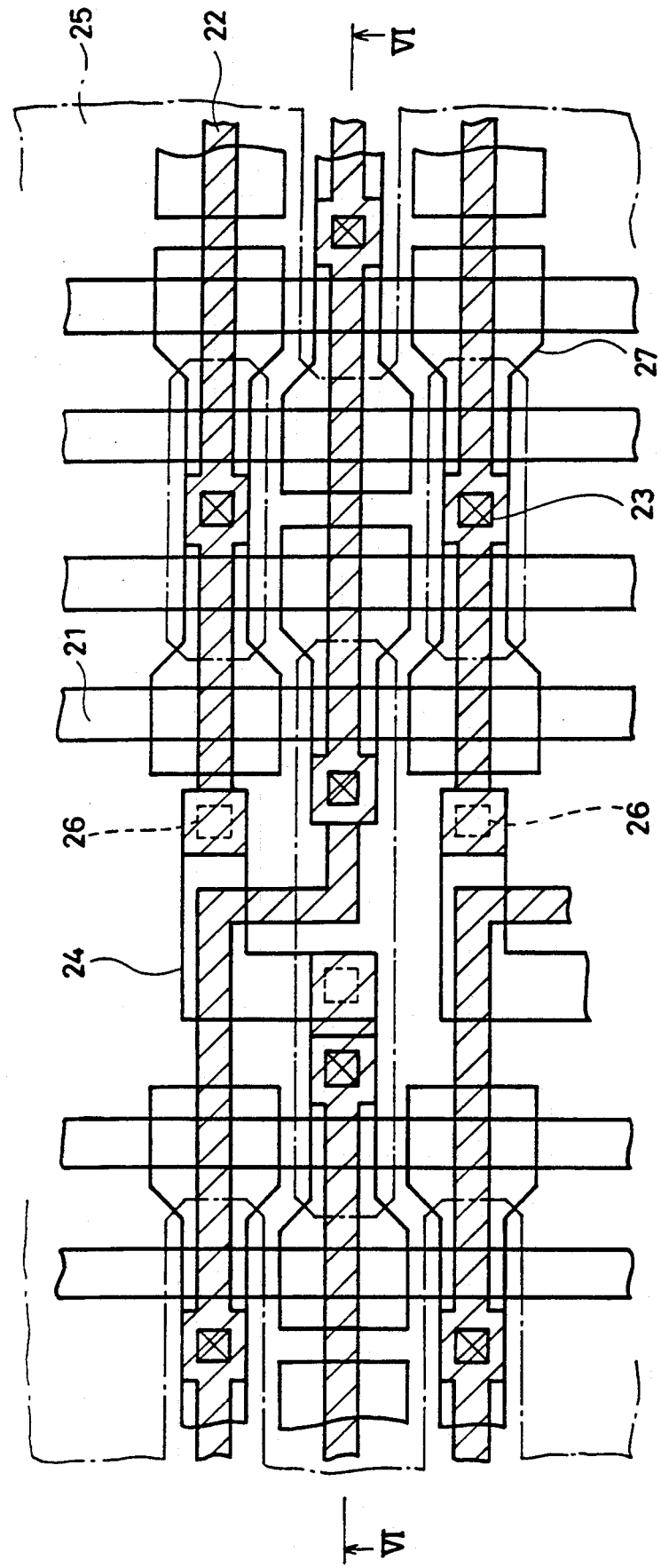
FIG. 5 is a plan view showing a structure of the intersecting section of the bit line pair shown in FIG. 4.
Figure 6:
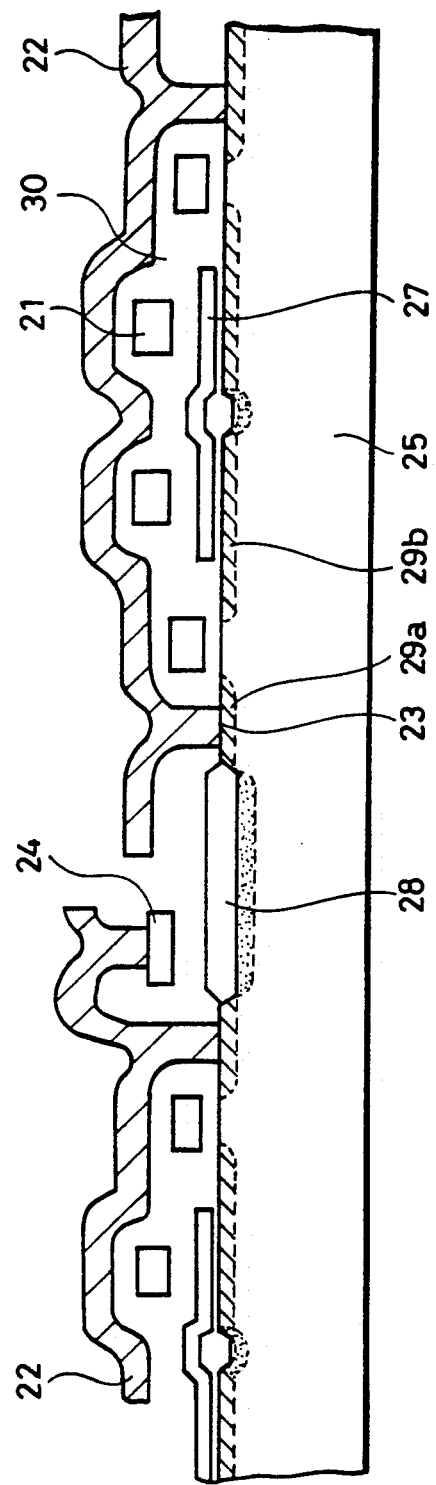
FIG. 6 is a cross sectional view taken along the line VI—VI of FIG. 5.
Figure 7:
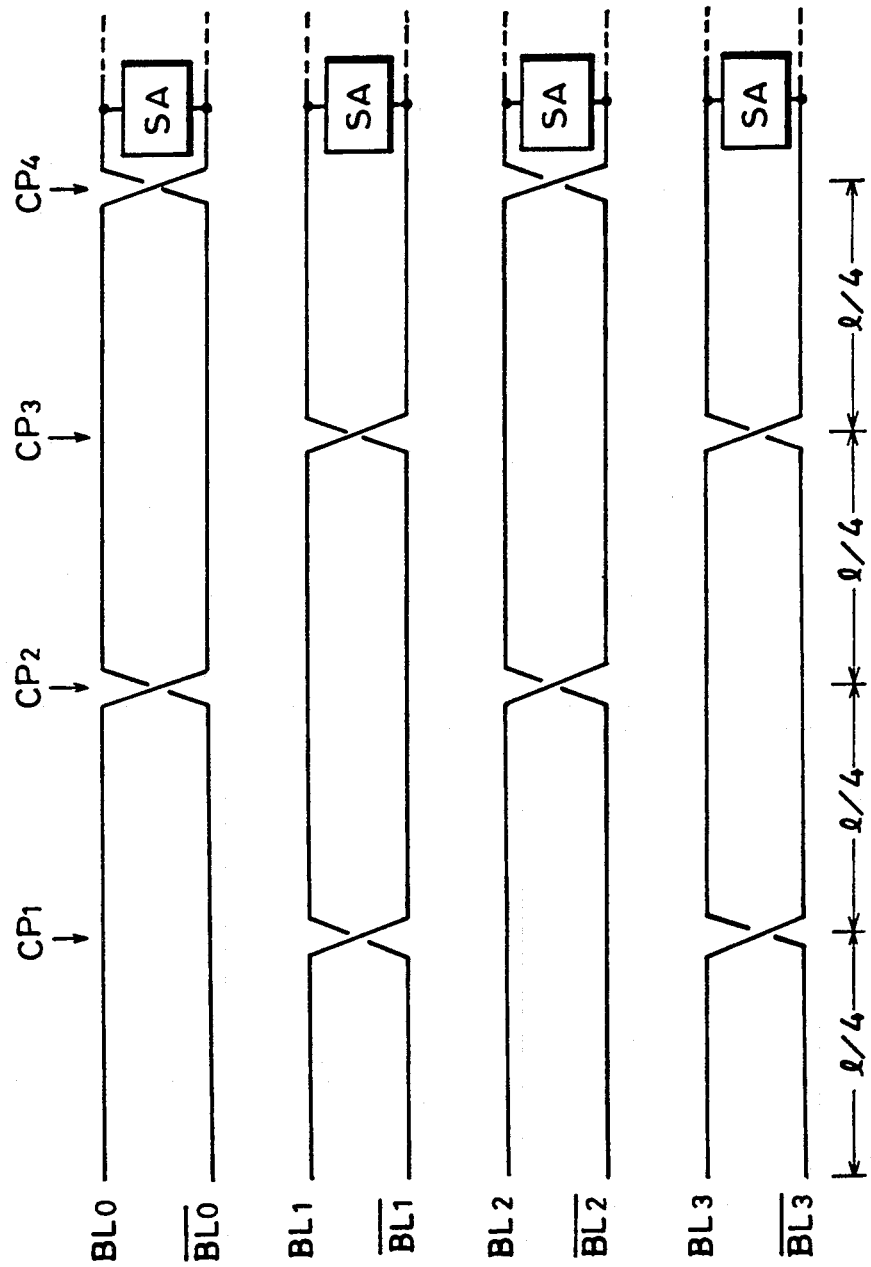
FIG. 7 shows another example of the bit line structure proposed in the related application.
Figure 8:
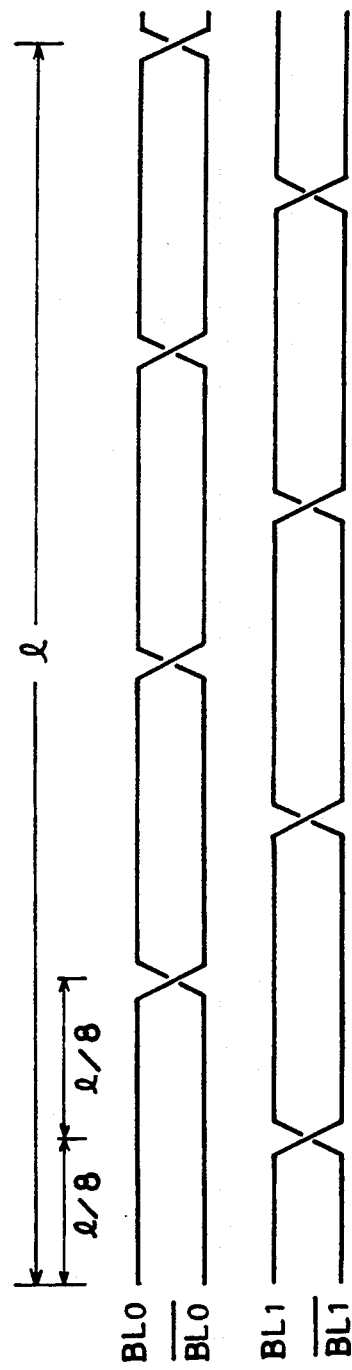
FIG. 8 shows a further example of the bit line structure the related application.

Namely, starting from the bit line pair $BL_0$ and $\overline{BL_0}$, the bit lines of the odd-numbered bit line pair intersect with each other at the points $CP_2$ and $CP_4$, while the bit lines of the even-numbered bit line pair intersect with each other at the points $CP_1$ and $CP_3$. This structure is essentially the same as that shown in FIG. 7, except the following point. Namely, when the length of the bit line is represented by l, the intersecting portions are provided such that the length of each of the sections a to e is $l_1$, 1/4, 1/4, 1/4, and $l_2$, respectively, where $l_1+l_2=l_4$.

Consequently, the capacitive coupling noise to each bit line pair from adjacent bit line pairs will be as follows, when considered in the same manner as in the prior art.

(1) The capacitive coupling noise $\Delta V_{BL1}$ and $\Delta V_{\overline{BL1}}$ to the bit lines $BL_1$ and $\overline{BL_1}$ from adjacent bit line pairs will be represented by the following equation.

$$\Delta V_{BL1} = \frac{\gamma}{1+\alpha}\left(\frac{l_1}{l}\Delta V_{BL0} + \tfrac{1}{4}\Delta V_{\overline{BL2}} + \tfrac{1}{4}\Delta V_{BL2} + \right.$$

$$\left. \tfrac{1}{4}\Delta V_{\overline{BL0}} + \frac{l_2}{l}\Delta V_{BL0}\right)$$

$$\Delta V_{\overline{BL1}} = \frac{\gamma}{1+\alpha}\left(\frac{l_1}{l}\Delta V_{BL2} + \tfrac{1}{4}\Delta V_{\overline{BL0}} + \tfrac{1}{4}\Delta V_{BL0} + \right.$$

$$\left. \tfrac{1}{4}\Delta V_{\overline{BL2}} + \frac{l_2}{l}\Delta V_{BL2}\right)$$

The bit line BL1 receives the noise $\Delta V_{BL0}\times l_1/l$ in the section a, the noise $\Delta V_{\overline{BL2}}\times\tfrac{1}{4}$ in the section b, the noise $\Delta V_{BL2}\times\tfrac{1}{4}$ in the section c, the noise $\Delta V_{\overline{BL0}}\times\tfrac{1}{4}$ in the section d, and the noise $\Delta V_{BL0}\times l_2/l$ in the section e. The bit line $\overline{BL1}$ receives the noise $\Delta V_{BL2}\times l_1/l$ in the section a, the noise $\Delta V_{\overline{BL0}}\times\tfrac{1}{4}$ in the section b, the noise $\Delta V_{BL0}\times\tfrac{1}{4}$ in the section c, the noise $\Delta V_{\overline{BL2}}\times\tfrac{1}{4}$ in the section d, and the noise $\Delta V_{BL2}\times l_2/l$ in the section e. Since $l_1+l_2=1/4$, the capacitive coupling noise $\Delta V_{BL1}$ is exactly equal to $\Delta V_{\overline{BL1}}$.

The capacitive coupling noise $\Delta V_{BL2}$ and the $\Delta V_{\overline{BL2}}$ to the bit lines $BL_2$ and $\overline{BL_2}$ from adjacent bit line pairs will be represented by the following equation.

$$\Delta V_{BL2} = \frac{\gamma}{1+\alpha}\left(\frac{l_1}{l}\Delta V_{\overline{BL1}} + \tfrac{1}{4}\Delta V_{BL1} + \tfrac{1}{4}\Delta V_{BL3} + \right.$$

$$\left. \tfrac{1}{4}\Delta V_{\overline{BL3}} + \frac{l_2}{l}\Delta V_{BL1}\right)$$

$$\Delta V_{\overline{BL2}} = \frac{\gamma}{1+\alpha}\left(\frac{l_1}{l}\Delta V_{BL3} + \tfrac{1}{4}\Delta V_{\overline{BL3}} + \tfrac{1}{4}\Delta V_{\overline{BL1}} + \right.$$

$$\left. \tfrac{1}{4}\Delta V_{BL1} + \frac{l_2}{l}\Delta V_{\overline{BL3}}\right)$$

Where $l_1+l_2=1/4$. Therefore, the noise to the bit line $BL_2$ is the same as the noise to the bit line $\overline{BL_2}$.

Similarly, the capacitive coupling noise to each of the bit line pairs from adjacent bit line pairs will be the same for all the bit line pairs. It is apparent that the bit line pair $BL_0$ and $\overline{BL_0}$ the end of the memory array receive the same capacitive coupling noise.

In the present embodiment, an intersection is further provided at the point $CP_4$ and the positions of the intersecting points $CP_1$ to $CP_4$ are well considered. Therefore, precisely well-balanced layout becomes possible for all bit line pairs, as in the even-numbered bit line pairs of the prior art. For example, if the bit line is formed of an Al layer and the wiring layer which can be intersect therewith is formed of a polysilicon layer, the bit line $BL_0$ should be formed of Al and the bit line $\overline{BL_0}$ should be formed of polysilicon at the intersection $CP_2$, while the bit line $BL_0$ should be formed of polysilicon and the bit line $BL_0$ be formed Al at the intersection $CP_4$. By doing so, the coupling capacitance $C_1$ of each of the bit line pairs becomes equal to each other, whereby the capacitances for all bit line pairs are well-balanced.

Figure 10:
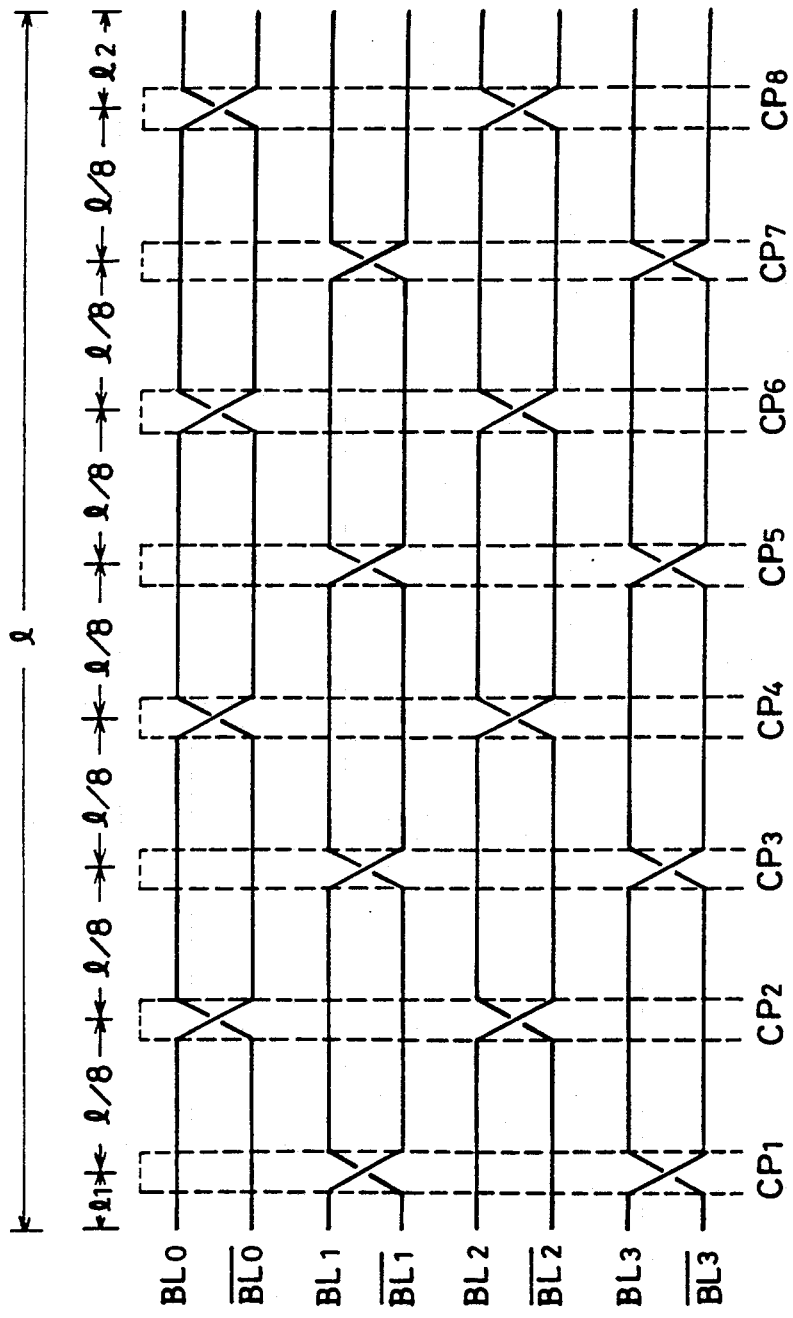
FIG. 10 shows a bit line structure in accordance with another embodiment of the present invention.

Although two intersections are provided at each bit line pair and all bit line pairs are divided into 5 sections in the above described embodiment, the number of intersections of each bit line pair may be an integer multiple of 2, that is, 4, 6, . . . and the bit line pairs may be divided into 9 sections, 13 sections . . . to provide the same effect as in the above described embodiment. In that case, the sum of the bit line length of the sections of both ends must be equal to the length of the bit line in each of the intermediate sections. FIG. 10 shows an example in which 4 intersections are provided in each bit line pair, and the bit line pair is divided into 9 sections. Basically, the structure of FIG. 9 is repeated twice in this example. It goes without saying that if the bit line length is represented by l, the equation "$l_1 + l_2 = 1/8$" is satisfied. In FIG. 9, the sense amplifier SA, the column decoder and so on are omitted.

As described above, in the bit line structure of the semiconductor memory device in accordance with the present invention, even-numbered intersecting portions are provided at each bit line pair, and each of the bit lines constituting the bit line pair is arranged such that one of the bit lines constituting each said bit line pair neighbors one of the bit lines constituting an adjacent one of the said bit line pairs for a first length and neighbors the other one of the bit lines constituting the said adjacent bit line pair for a second length; and the other one of the bit lines constituting the bit line pair neighbors the said one of the bit lines of the said adjacent bit line pair for the said first length and neighbor said the other one of the bit lines of the said adjacent bit line pair for the said second length. Consequently, the capacitance noise between bit line pairs can be eliminated, and the stray capacitances of all bit line pairs can be well-balanced. In addition, the soft errors caused by degradation of reading voltage difference can be prevented, and the operation margin in signal reading can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in a matrix constituted by rows and columns for storing charges representing information;
   a plurality of bit line pairs each constituted of a pair of bit lines said bit lines provided corresponding to the rows of said plurality of memory cells and connected to said memory cells of the corresponding rows; and
   a plurality of sense amplifier means arranged corresponding to said plurality of bit line pairs for detecting, when the charges representing information of said memory cells are read, a potential difference appearing on said bit line pair; wherein
   each of said plurality of bit line pairs comprises an even number of intersecting portions, said intersecting portions being arranged such that one of the bit lines constituting each said bit line pair is adjacent one of the bit lines constituting a neighboring one of said bit line pairs for a first length and is adjacent the other one of the bit lines constituting said neighboring bit line pair for a second length; and the other one of the bit lines constituting the bit line pair is adjacent said one of the bit lines of said neighboring bit line pair for said second length and is adjacent said other of the bit lines of said neighboring bit line pair for said second length.

2. A semiconductor memory device according to claim 1, wherein the number of said intersecting portions in each of said plurality of bit line pairs is the same.

3. A semiconductor memory device according to claim 1, wherein a first bit line and a second bit line constituting one of said bit line pairs are formed of different materials at said intersecting portion.

4. A semiconductor memory device according to claim 3, wherein
   said first bit line is formed of a first interlayer material and said second bit line is formed of a second interlayer material at half of said intersecting portions, and said first bit line is formed of said second interlayer material and said second bit line is formed of said first interlayer material at the remaining half of said intersecting portions.

5. A semiconductor memory device according to claim 4, wherein
   said first interlayer material is polysilicon and
   said second interlayer material is aluminum.

6. A semiconductor memory device comprising:
   a plurality of memory cells arranged in a matrix of rows and columns for storing charges representing information;
   a plurality of bit line pairs each comprising a pair of bit lines, said bit lines provided corresponding to the rows of said plurality of memory cells and connected to said memory cells of the corresponding rows wherein
   each of said plurality of bit line pairs comprises an even number of intersecting portions of each said bit line pair, at least one of said even number of intersecting portions in each bit line pair being positioned midway between intersecting portions in an adjacent bit line pair, said intersecting portions being arranged such that end portions of said bit line pairs are formed exterior to said intersecting portions in each bit line pair, the sum of the lengths of opposite end portions of each bit line pair being equal to the distance between said intersecting portions of said bit line pair 7. A semiconductor memory device according to claim 6, wherein the number of said intersecting portions in each of said plurality of bit line pairs is the same.

8. A semiconductor memory device according to claim 6, wherein a first bit line and a second bit line constituting one of said bit line pairs are formed of different materials at said intersecting portion.

9. A semiconductor memory device according to claim 8, wherein
   said first bit line is formed of a first interlayer material and said second bit line is formed of a second interlayer material at half of said intersecting portions, and said first bit line is formed of said second interlayer material and said second bit line is formed of said first interlayer material at the remaining half of said intersecting portions.

10. A semiconductor memory device according to claim 9, wherein
said first interlayer material is polysilicon and said second interlayer material is aluminum.

11. A semiconductor memory device as recited in claim 6, wherein one said end portion of each said bit line pair has a length defined by the distance from the connection of a sense amplifier to said bit line pair and an intersecting portion of said bit line pair adjacent said sense amplifier.

12. A semiconductor memory device comprising:
a plurality of memory cells arranged in a matrix constituted by rows and columns for storing charges representing information;
a plurality of bit line pairs each comprising a pair of bit lines, said bit lines provided corresponding to the rows of said plurality of memory cells and connected to said memory cells of the corresponding rows wherein
each of said plurality of bit line pairs comprises an even number of intersecting portions of each said bit line pair, at least one of said even number of intersecting portions in each bit line pair being positioned midway between intersecting portions in an adjacent bit line pair, said intersecting portions being arranged such that end portions of said bit line pairs are formed exterior to said intersecting portions in each bit line pair, the sum of the lengths of opposite end portions of each bit line pair being effectively equal, in capacitive coupling to an adjacent bit line pair, to a distance between said intersecting portions of said bit line pair.

13. A semiconductor memory device as recited in claim 12, wherein one said end portion of each said bit line pair has a length defined by the distance from the connection of a sense amplifier to said bit line pair to an intersecting portion of said bit line pair adjacent said sense amplifier.

14. The semiconductor memory device according to claim 1 wherein said first length is substantially equal to said second length.

* * * * *